United States Patent
Suzuki (10) Patent No.: US 7,569,894 B2
(45) Date of Patent: Aug. 4, 2009

(54) SEMICONDUCTOR DEVICE WITH NMOS TRANSISTORS ARRANGED CONTINUOUSLY

(75) Inventor: Fumiaki Suzuki, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 158 days.

(21) Appl. No.: 11/434,262

(22) Filed: May 16, 2006

(65) Prior Publication Data

US 2006/0261417 A1 Nov. 23, 2006

(30) Foreign Application Priority Data

May 17, 2005 (JP) .............................. 2005-144723

(51) Int. Cl.
*H01L 27/092* (2006.01)
(52) U.S. Cl. ............... 257/370; 257/206; 257/E27.062; 257/67
(58) Field of Classification Search .................. 257/67, 257/206, 370, E27.062
See application file for complete search history.

(56) References Cited

U.S. PATENT DOCUMENTS 5,334,861 A * 8/1994 Pfiester et al. ................. 257/67
5,714,394 A * 2/1998 Kadosh et al. ............... 438/199
2003/0127697 A1 * 7/2003 Ohta et al. ................... 257/390

FOREIGN PATENT DOCUMENTS

JP 2001-345430 12/2001
JP 2003-203989 7/2003

* cited by examiner

*Primary Examiner*—Jerome Jackson, Jr.
*Assistant Examiner*—Jami M Valentine
(74) *Attorney, Agent, or Firm*—McGinn IP Law Group, PLLC (57) ABSTRACT

A semiconductor device includes a plurality of PMOS transistors formed on a semiconductor substrate; and a plurality of NMOS transistors formed on the semiconductor substrate. The plurality of PMOS transistors are electrically isolated from each other by a device isolation structure formed in the semiconductor substrate. The plurality of NMOS transistors are continuously formed in a first direction such that a sequence of N-type diffusion layers of the plurality of NMOS transistors extends in the first direction. One of the plurality of PMOS transistors and one of the plurality of NMOS transistors share a gate electrode.

14 Claims, 11 Drawing Sheets

SEMICONDUCTOR DEVICE WITH NMOS TRANSISTORS ARRANGED CONTINUOUSLY

BACKGROUND OF THE INVENTION

1. Field of the Invention

The present invention relates to a semiconductor device. More particularly, the present invention relates to a semiconductor device including PMOS transistors and NMOS transistors, and a manufacturing method of the same.

2. Description of the Related Art

It is indispensable in designing an LSI (Large-Scaled Integrated Semiconductor Device) to use a computer for the sake of reduction in time for designing and confirmation and to eliminate man-caused mistakes. A semiconductor device design supporting system using the computer in this manner is referred to as a CAD (Computer Aided Design) system. According to a LSI designing method of cell base, cells of a plurality of types are configured as a library. A designer executes designing of LSI by utilizing CAD and allocating a desired cell in a layout space defined on the computer.

Figure 1:
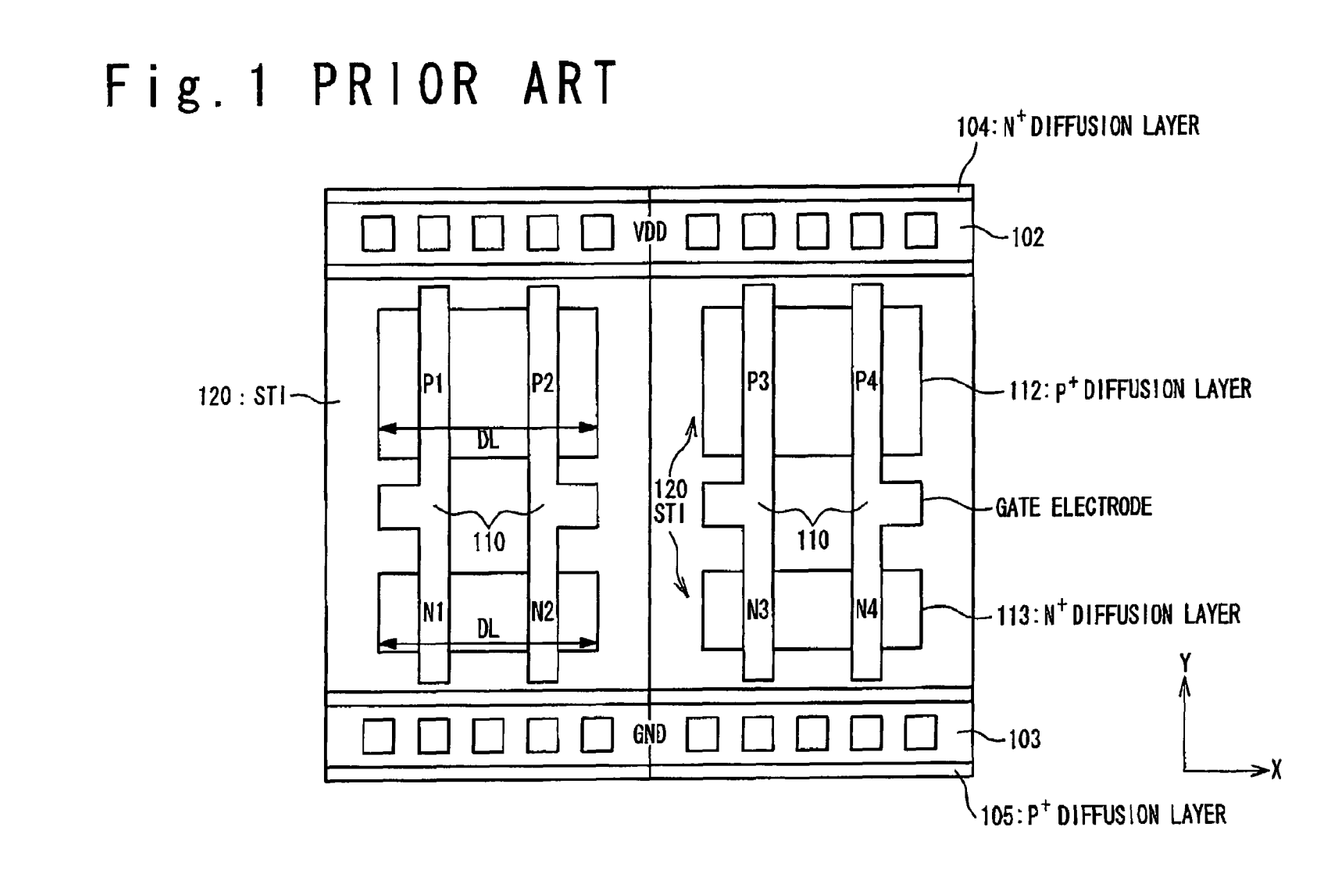
FIG. 1 is a top plan view showing basic cells for forming a conventional semiconductor device.

FIG. 1 shows basic cells (primitive cells) for designing a conventional semiconductor device. In each of the basic cells, a power supply line 102 for supplying a power supply voltage VDD and a ground line 103 for supplying a ground voltage GND are arranged along a X-direction. The power supply line 102 and the ground line 103 are connected to a N-type diffusion layer 104 and P-type diffusion layer 105 for applying substrate voltages via contacts, respectively. Further, PMOS transistors P1 to P4 and NMOS transistors N1 to N4 are formed in a region between by the power supply line 102 and the ground line 103. Specifically, a gate electrode 110 is formed along a Y-direction. P-type diffusion layers 112 are formed in a region for the PMOS transistors to be formed to put the gate electrode 110 therebetween, and N-type diffusion layers 113 are formed in a region for the NMOS transistors to be formed to put the gate electrode 110 therebetween. Further, for the sake of isolation or separation of elements, a STI (Shallow Trench Isolation) structure 120 is formed as an element isolation structure.

In a semiconductor device field, in many cases, a plurality of transistors are used collectively. For this reason, each of the basic cells is formed in such a manner that a "transistor group" composed of a plurality of transistors is surrounded by a STI structure 120. For example, in FIG. 1, the PMOS transistor group P1 and P2 is surrounded by the STI structure 120, and the PMOS transistor group P3 and P4 is surrounded by the STI structure 120. That is, the PMOS transistor group P1 and P2 and the PMOS transistor group P3 and P4 are isolated or separated by the STI structures 120. Further, an NMOS transistor group N1 and N2 is surrounded by the STI structure 120 and an NMOS transistor group N3 and N4 is surrounded by the STI structure 120. That is, the NMOS transistor group N1 and N2 and the NMOS transistor group N3 and N4 are isolated by the STI structures 120. Meanwhile, the length of one transistor group in the X-direction is referred to as a "diffusion layer length DL". In other words, the diffusion layer length DL can be defined as the length between STI structures 120 in the X-direction.

In conjunction with the above description, a semiconductor device is disclosed in Japanese Laid open Patent Publication (JP-P2003-203989A). In this conventional example, the semiconductor device includes P-channel field effect transistors connected in a lattice form. In the semiconductor device of this type, a long active region extending over a plurality of transistors is divided for every gate electrode such that a compression stress is applied to a channel portion of the P-channel field effect transistor. A sufficiently thin STI structure is arranged between the gate electrodes.

Also, a semiconductor integrated circuit device is disclosed in Japanese Laid Open Patent Publication (JP-P2001-345430A), in which element structure MISFET and element isolation MISFET are formed on a main surface of a semiconductor substrate. The element structure MISFET and the element isolation MISFET of include a source and a drain which are formed in a semiconductor substrate, a gate insulating film formed between the source and the drain on the semiconductor substrate, and a doped gate electrode formed on the gate insulating film. Besides, a difference in work function between the gate electrode of the element isolation MISFET and the main surface of the semiconductor substrate is greater than a difference in work function between the gate electrode of the element constitution MISFET and the main surface of the semiconductor substrate.

A stress generated due to isolation of elements by the STI structure (hereinafter, to be also referred to as a STI structure stress) changes the crystal structure. The change in the crystal structure has an influence upon characteristics of transistors, for example, driving capability of a transistor. In recent years, miniaturization of the element has made remarkable progress, and the STI structure stress has become a significant problem. Namely, as the element is miniaturized, the STI structure stress that influences the driving capability of the transistor has become one of factors which cannot be ignored. For example, it is known that magnitude of ON current Ion of the transistor (drain current) fluctuates depending on change in the STI structure stress. Since the STI structure stress depends upon the above diffusion layer length DL as a distance between STI structures, the diffusion layer length DL has an effect upon magnitude of ON current Ion.

Figure 2:
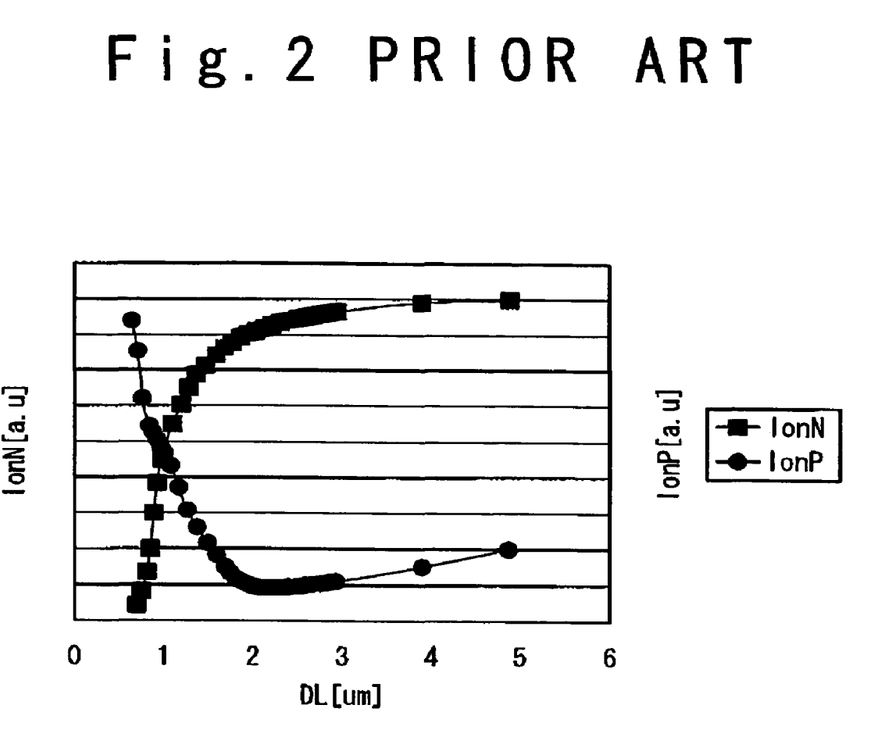
FIG. 2 is a graph showing dependence of drain current on diffusion layer length.

FIG. 2 shows dependence of ON current Ion on the diffusion layer length DL. A vertical axis represents ON current IonN of the NMOS transistor and ON current IonP of the PMOS transistor. A horizontal axis represents the diffusion layer length DL. As shown in FIG. 2, in the PMOS transistor, when the diffusion layer length DL is shorter, the ON current IonP is larger. Contrary, in the NMOS transistor, when the diffusion layer length DL is longer, the ON current IonN is larger. In other words, the characteristics of the PMOS transistors can be improved with the shorter diffusion layer length DL and the characteristics of the NMOS transistors can be improved with the longer diffusion layer length DL.

In consideration of miniaturization of the elements, it is desired to provide a technique that can improve the characteristics of ON current (drain current) as much as possible for both the PMOS transistors and the NMOS transistors. When the diffusion layer length DL is simply elongated in the NMOS transistor, many NMOS transistors are arranged in a region between the STI structures. In this case, it is not possible to use a desired number of NMOS transistors among many NMOS transistors. In other words, if the diffusion layer length DL is simply elongated, isolation of a desired number of elements is not possible and handling of a desired number of elements is not possible accordingly.

SUMMARY OF THE INVENTION

In an aspect of the present invention, a semiconductor device includes a plurality of PMOS transistors formed on a semiconductor substrate; and a plurality of NMOS transistors formed on the semiconductor substrate. The plurality of PMOS transistors are electrically isolated from each other by a device isolation structure formed in the semiconductor substrate. The plurality of NMOS transistors are continuously formed in a first direction such that a sequence of N-type diffusion layers of the plurality of NMOS transistors extends in the first direction. One of the plurality of PMOS transistors and one of the plurality of NMOS transistors share a gate electrode.

Here, the semiconductor device may further include gate structures formed on the semiconductor substrate to extend in a second direction orthogonal to the first direction over the sequence of the N-type diffusion layers.

In this case, a voltage of the gate structures may be fixed to a ground voltage. Instead, the voltage of the gate structures may be fixed to a power supply voltage.

The gate structures may isolate the plurality of NMOS transistors in units of a predetermined number of NMOS transistors. In this case, the predetermined number may be one of two, four and six.

Also, two of the gate electrodes of the two NMOS transistors may be connected to each other. Also, four of the gate electrodes of the four NMOS transistors may be connected to each other.

Also, in another aspect of the present invention, a semiconductor device includes a plurality of transistor cells arranged in a first direction. Each of the plurality of transistor cells includes a first PMOS transistor formed on a semiconductor substrate; a second PMOS transistor formed on the semiconductor substrate adjacently to the first PMOS transistor; a device isolation structure configured to isolate the first and second PMOS transistors from each other; a first NMOS transistor formed on the semiconductor substrate; and a second NMOS transistor formed on the semiconductor substrate adjacently to the first NMOS transistor. N-type diffusion layers of the first and second NMOS transistors are arranged in the first direction.

Here, the N-type diffusion layers may reach at least one of two opposing sides of the cell orthogonal to the first direction. Especially, the N-type diffusion layers may reach the two opposing sides of the cell orthogonal to the first direction.

In this case, the cell may further include a half of a gate structure provided on the semiconductor substrate to extend over the N-type diffusion layers in a second direction orthogonal to the first direction. A remaining half of the gate structure is provided in one cell adjacent to the cell.

Also, the semiconductor device may further include a device isolation cell provided for every predetermined number of the plurality of transistor cells. The device isolation cell includes a gate structure provided on the semiconductor substrate to extend in a second direction orthogonal to the first direction; and N-type diffusion layers formed in the semiconductor substrate to be adjacent to the gate structure. The N-type diffusion layers of the device isolation cell reach two opposing sides of the device isolation cell orthogonal to the first direction.

Here, the predetermined number may be one of two, four and six.

Also, two of the gate electrodes of the two NMOS transistors may be connected to each other, and four of the gate electrodes of the fourth NMOS transistors may be connected to each other.

In another aspect of the present invention, a method of manufacturing a semiconductor device, is achieved by (A) providing a basic cell and a device isolation cell; wherein the basic cell includes: a PMOS transistor surrounded by the device isolation structure; and a first N-type diffusion layer of an NMOS transistor configured to contacting one of two opposing sides of the basic cell, and the device isolation cell includes: a second group of N-type diffusion layers configured to contact two opposing sides of the device isolation cells; and a gate structure provided on a semiconductor substrate in a region put in the second group of N-type diffusion layers, and the first N-type diffusion layer of the basic cell is formed to be aligned with the first N-type diffusion layer of another basic cell, and the second group of N-type diffusion layers the device isolation cell in a first direction, by (B) arranging the basic cell repeatedly in the first direction; and by (C) arranges the device isolation cell to be adjacent to the arranged basic cell in the first direction.

Here, the gate structure of the device isolation cell may be grounded.

Also, the basic cell may have a gate electrode of the PMOS transistor and the NMOS transistor, and the gate electrode may be formed to extend in a second direction orthogonal to the first direction.

DESCRIPTION OF THE PREFERRED EMBODIMENTS

Hereinafter, a semiconductor device and a method of manufacturing the same according to the present invention will be described in detail with reference to the attached drawings. The semiconductor device according to the present invention includes PMOS transistors and NMOS transistors.

First Embodiment

Figure 3:
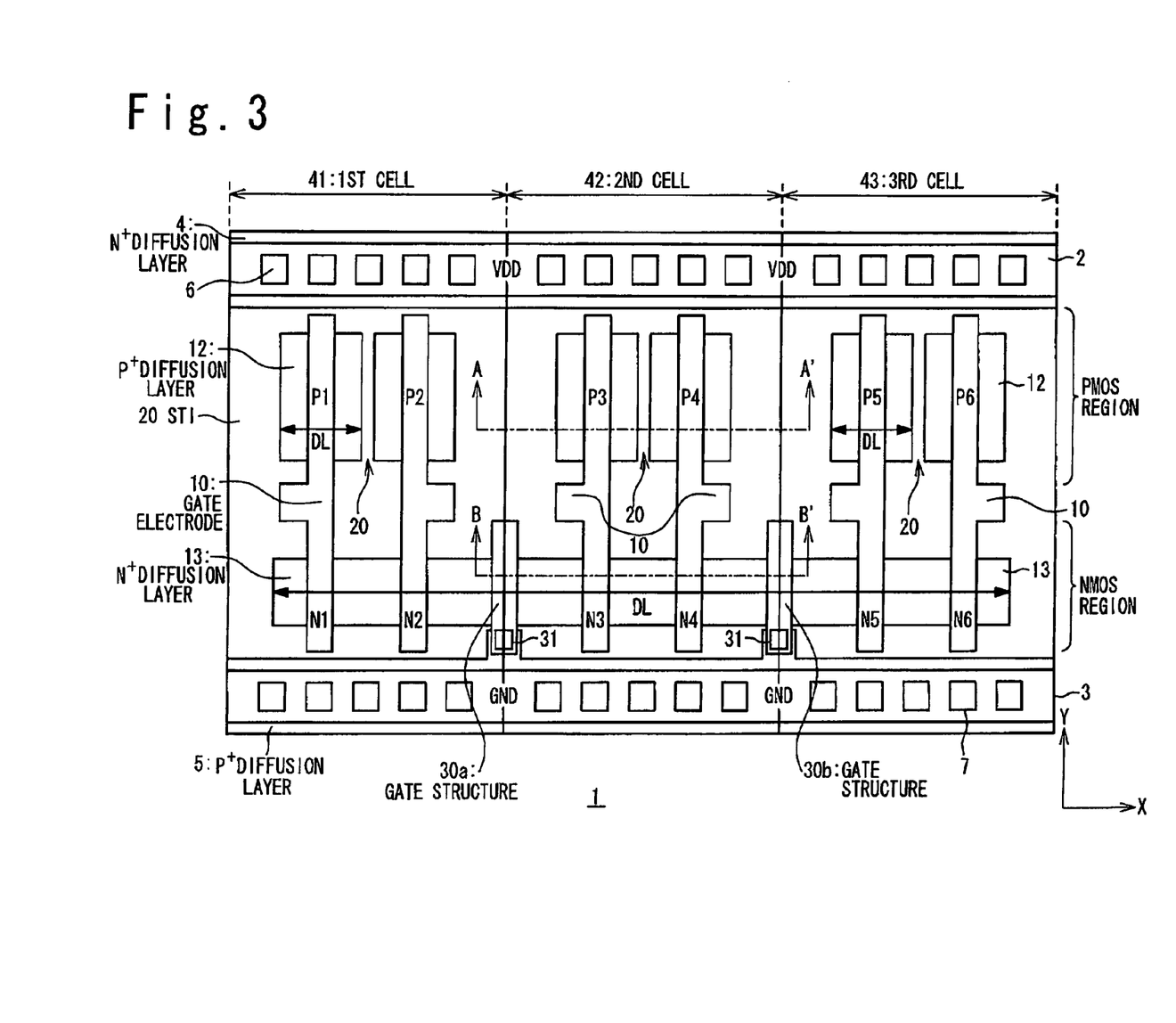
FIG. 3 is a top plan view showing a structure of a semiconductor device according to a first embodiment of the present invention.

FIG. 3 is a plan view showing a pattern structure of a semiconductor device 1 according to the first embodiment of the present invention. Referring to FIG. 3, a power supply line 2 for supplying a power supply voltage VDD and a ground line 3 for supplying a ground voltage GND are arranged to extend in an X-direction. The power supply line 2 is connected to an N-type diffusion layer 4 via contacts 6 to apply a power supply voltage as a substrate voltage. Further, the ground line 3 is connected to a P-type diffusion layer 5 via contacts 7 to apply a ground voltage as the substrate voltage. A plurality of PMOS transistors P1 to P6 and a plurality of NMOS transistors N1 to N6 are formed in a region put between the power supply line 2 and the ground line 3. Specifically, the plurality of PMOS transistors P1 to P6 are formed in a PMOS region to be aligned with each other along an X-direction. Also, the plurality of NMOS transistors N1 to N6 are formed in a NMOS region to be aligned with each other along the X-direction.

A plurality of gate electrodes 10 are formed for the plurality of PMOS transistors P1 to P6 and the plurality of NMOS transistors N1 to N6. These gate electrodes 10 are formed to extend in a Y-direction orthogonal to the X-direction. Also, each of the gate electrodes 10 is shared by one PMOS transistor and one NMOS transistor. In the PMOS region, P-type diffusion layers 12 are formed to put the gate electrode 10 therebetween. Also, in the NMOS region, N-type diffusion layers 13 are formed to put the gate electrode 10 therebetween. Further, a STI structure 20 is formed as an element separation structure. According to the present invention, in the PMOS region, each of the plurality of PMOS transistors P1 to P6 is surrounded by the STI structure 20. For example, the STI structure 20 is formed between the PMOS transistors P1 and P2. On the other hand, in the NMOS region, the plurality of NMOS transistors N1 to N6 are surrounded as a whole by the STI structure 20. For example, the STI structure 20 is not formed between the NMOS transistors N2 and N3. That is, the plurality of NMOS transistors N1 to N6 are continuously formed to be adjacent to each other and constitute a "NMOS transistor group". In other words, one NMOS transistor group includes a large number of NMOS transistors. Meanwhile, one PMOS transistor group includes only one PMOS transistor. The length of one transistor group in the X-direction is defined to be "diffusion layer length DL". Further, the diffusion layer length DL can be defined to be a distance between the STI structures 20 in the X-direction. According to the present invention, the diffusion layer length DL in the NMOS transistor group is longer than the diffusion layer length DL in the PMOS transistor group.

As shown above, each of the PMOS transistors is separated by using the STI structure 20. Each of the plurality of NMOS transistors of the NMOS transistor group should be separated. Here, in order to keep the diffusion layer length DL long to a maximum extent, a separation structure other than the STI structure 20 should be employed. To attain this, according to the present invention, as shown in FIG. 3, a gate structure 30 is formed at a predetermined position in the NMOS region. The gate structure 30 is located in a region between adjacent NMOS transistors. Also, the gate structure 30 is formed on the N-type diffusion layer 13 to extend in the Y-direction, like the gate electrode 10. The gate structure 30 is connected to the ground line 3 or the P-type diffusion layer 5 that is connected to the ground line 3 via a contact 31. That is, the gate structure 30 is grounded and the voltage thereof is fixed to the ground voltage GND. Since the voltage of the gate structure 30 is the ground voltage, its gate structure 30 is equivalent to a transistor in OFF state. Therefore, it is possible to isolate the NMOS transistors themselves at a predetermined position in the NMOS region without using the STI structure 20. For example, a gate structure 30a isolates a set of the NMOS transistors N1 and N2 from a set of the NMOS transistors N3 and N4. Further, a gate structure 30b isolates a set of the NMOS transistors N3 and N4 from a set of the NMOS transistors N5 and N6. In this way, according to the present invention, element isolation for NMOS transistors can be realized using the gate structure 30 in place of the STI structure 20.

Figure 4A:
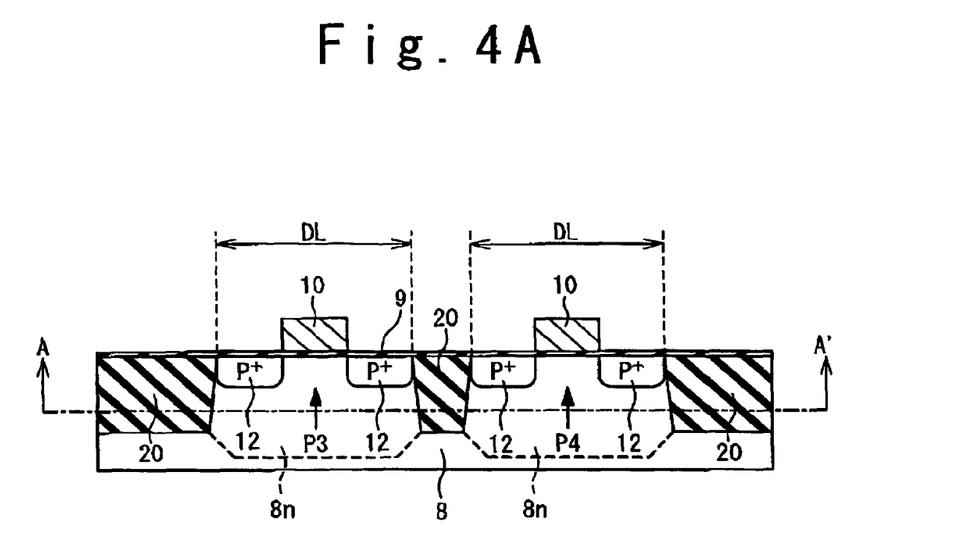
FIG. 4A is a sectional view showing the structure of the semiconductor device along a line A-A' in FIG. 3.

FIG. 4A is a cross sectional view of the semiconductor device along the line A-A' in FIG. 3. As shown in FIG. 4A, the PMOS transistors P3 and P4 are formed on N-type regions 8n of a substrate 8 adjacently to each other. In each of the PMOS transistors, the gate electrode 10 is formed on the substrate 8 via a gate insulating film 9. Also, the P-type diffusion layers 12 are formed in the N-type regions 8n of the substrate 8 under the gate electrode 10. Each of PMOS transistors is surrounded by the STI structure 20, and the STI structure 20 is formed in the substrate 8 between the PMOS transistors P3 and P4. The length of a region surrounded by the STI structure 20 is a diffusion layer length DL.

Figure 4B:
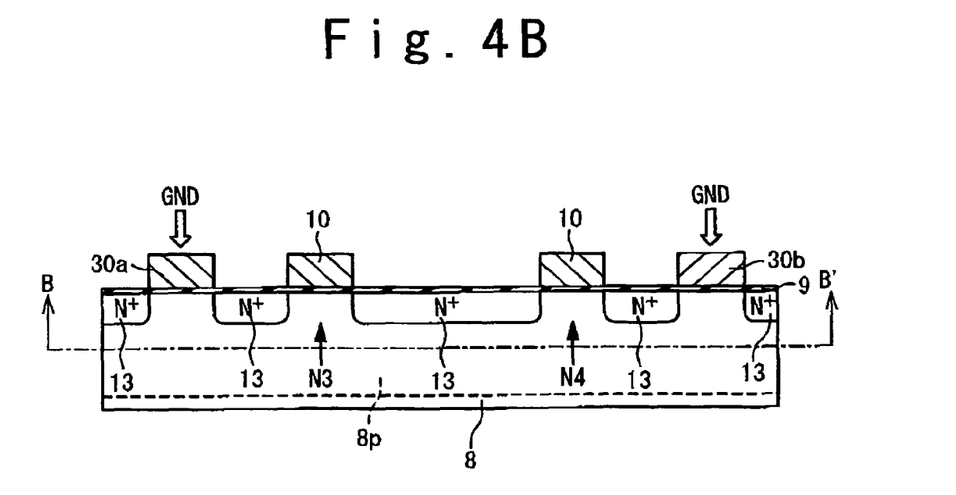
FIG. 4B is a sectional view showing the structure of the semiconductor device along a line B-B' in FIG. 3.

Also, FIG. 4B is a sectional view of the semiconductor device along the line B-B' in FIG. 3. As shown in FIG. 4B, the NMOS transistors N3 and N4 are formed on a P-type region 8p of the substrate 8 adjacently to each other. In each of the NMOS transistors, the gate electrode 10 is formed on the substrate 8 via the gate insulating film 9. The N-type diffusion layers 13 are formed in the P-type region 8p of the substrate 8 in a region under the gate electrode 10. Further, the gate structures 30a and 30b are formed on the substrate 8 via the gate insulating film 9. The N-type diffusion layers 13 are formed in the substrate 8 in region below the gate structure 30. Further, the ground voltage GND is applied to the gate structures 30a and 30b.

By using the semiconductor device 1 as shown above, and connecting appropriately the PMOS transistors and the NMOS transistors, various logic circuits are realized. The semiconductor device 1 shown in FIG. 3 may be used in a gate array fashion. The semiconductor device 1 shown in FIG. 3 may be provided as a foundation layer of ASIC (Application Specific Integrated Circuit). In case of ASIC, its foundation layer is used in common to many purposes and wirings meeting user requirements are formed in a customized layer as an upper layer of the foundation layer. With this configuration, a desired LSI is obtained in a short time.

As described above, according to the semiconductor device 1 according to the first embodiment of the present invention, the PMOS transistors are formed one by one to be surrounded by an element separation STI structure 20. For this reason, the diffusion layer length DL becomes minimum and characteristics of ON current can be improved as shown in FIG. 2. On the other hand, the NMOS transistors are arranged continuously to constitute the NMOS transistor group. In the NMOS transistor group, each of the NMOS transistors is not isolated by the STI structure 20. Therefore, the diffusion layer length DL becomes longer and characteristics of ON current can be improved as shown in FIG. 2. In this way, characteristics of ON current can be improved in both the PMOS transistors and the NMOS transistors. Since driving capabilities of both the PMOS transistors and the NMOS transistors are improved, the delay time is reduced.

Also, according to the first embodiment, a voltage of the gate structure 30 formed in the NMOS region is fixed to the ground voltage GND. Thus, it is possible to electrically isolate adjacent NMOS transistors from each other at the position of the gate structure 30. That is, the element separation or isolation can be carried out by using the gate structure 30 without using the STI structure 20 that is related to deterioration of characteristics of ON current. Thus, elongation of the diffusion layer length DL in the NMOS region and the element isolation in the NMOS region are both accomplished by the gate structure 30 according to the first embodiment. Further, since the element separation or isolation is realized in the NMOS region, it is possible to handle the desired number of NMOS transistors in the NMOS transistor group. Thus, the designing can be carried out freely. For example, when transistors are to be used in units of two, the gate structures 30a and 30b may simply be formed at the positions shown in FIG. 3. According to the first embodiment, it is possible to carry out element separation without consideration of effects by the diffusion layer length DL. Therefore, characteristic of ON current is improved and at the same time, the degree of freedom in designing is improved.

Further, according to the first embodiment, reduction of chip area usage efficiency in layout can be prevented. The diffusion layer length DL in the PMOS transistor is shortened and the diffusion layer length DL in the NMOS transistors is lengthened. Therefore, the diffusion layer lengths DL between the PMOS region and the NMOS region are different. If the element isolation is not made for the NMOS transistors, a dimension of one PROS transistor and a dimension of one NMOS transistor are different. As a result, when one NMOS transistor is allocated to one PMOS transistor, a useless region will be generated due to their dimension difference. However, according to the first embodiment, since the element isolation is realized by the gate structure 30, it is possible to make the dimension of one PMOS transistor coincident with that of one NMOS transistor. Thus, since no useless region is generated, the reduction in chip area usage efficiency is prevented.

Second Embodiment

The semiconductor device 1 according to the present invention can be designed by cell-base technique and manufactured. For example, the structure shown in FIG. 3 can be realized by a combination of a first cell 41, a second cell 42 and a third cell 43. The first cell 41 includes PMOS transistors P1 and P2, NMOS transistors N1 and N2 and half of the gate structure 30a. The second cell 42 includes PMOS transistors P3 and P4, NMOS transistors N3 and N4, half of the gate structure 30a and half of the gate structure 30b. The third cell 43 includes PMOS transistors P5 and P6, NMOS transistors N5 and N6 and half of the gate structure 30b. The first cell 41 and the second cell 42 are arranged so that the gate structure 30a is formed when they are adjacent to each other. Further, the second cell 42 and the third cell 43 are arranged so that the gate structure 30b is formed when they are adjacent to each other.

Figure 5:
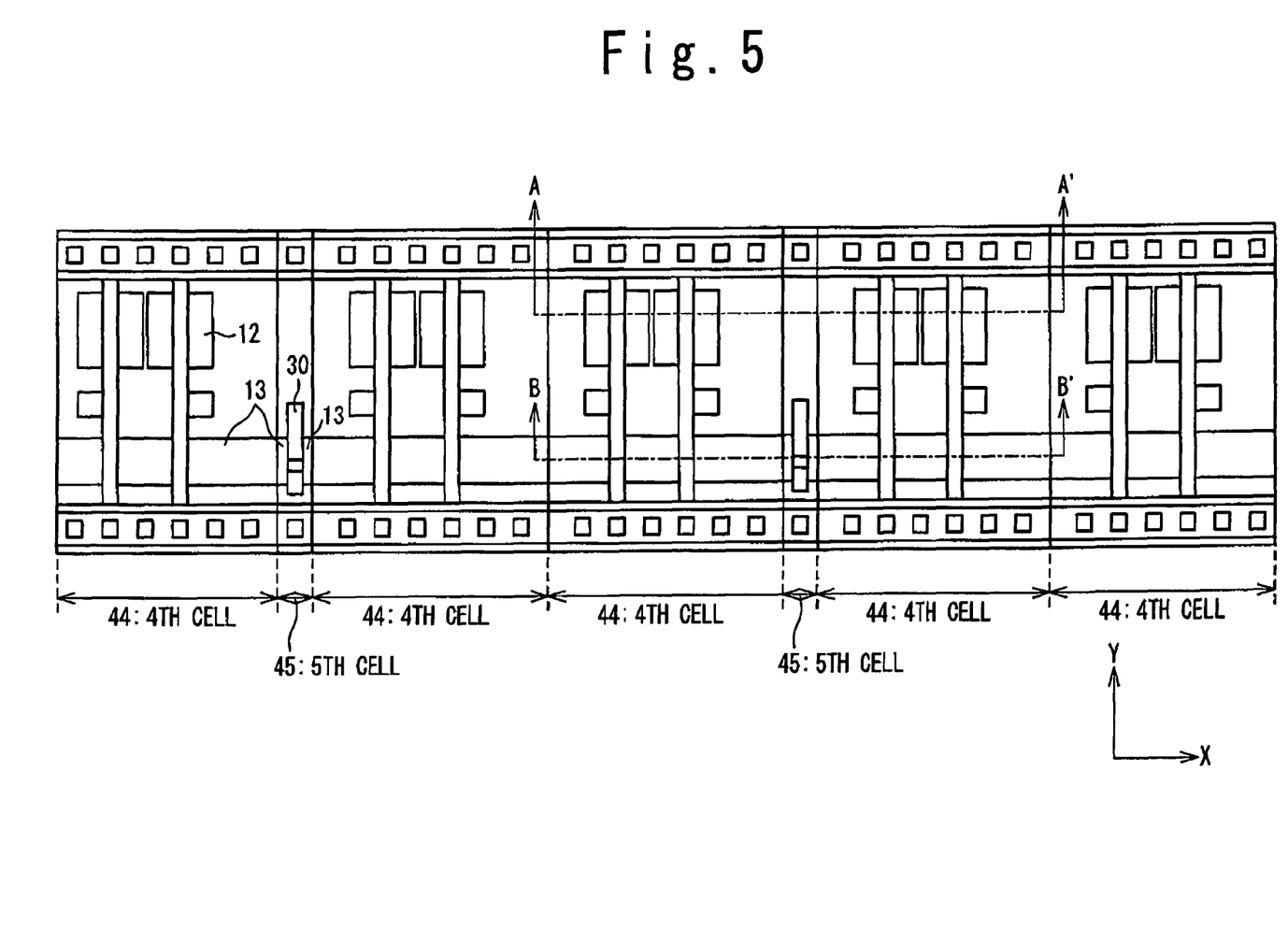
FIG. 5 is a top plan view showing arrangement of cells in the semiconductor device according to a second embodiment of the present invention.

Further, the semiconductor device 1 according to the present invention can be also realized by a combination of cell groups of different types. FIG. 5 is a plan view showing arrangement of cells in the semiconductor device according to the second embodiment of the present invention. As shown in FIG. 5, a plurality of fourth cells 44 and a plurality of fifth cells 45 are arranged in the X-direction. The fourth cell 44 is a basic cell. On the other hand, the fifth cell 45 is an element isolation cell to be used for the element isolation. The element isolation cell 45 is arranged adjacent to the plurality of basic cells 44.

The PMOS transistors and the NMOS transistors shown in FIG. 5 are formed in the basic cell (fourth cell). Specifically, the gate electrode 10 is formed to extend in the Y-direction orthogonal to the X-direction. One gate electrode 10 is shared by one PMOS transistor and one NMOS transistor. Further, the P-type diffusion layers 12 are formed in the PMOS region to put the gate electrode 10 therebetween, and the N-type diffusion layers 13 are formed in the NMOS region to put the gate electrode 10 therebetween. The N-type diffusion layer (group) 13 is formed to extend to an end portion of the basic cell 44 in the X-direction. That is, the N-type diffusion layer 13 is in contact with at least one of two opposing sides of the basic cell 44. Meanwhile, the PMOS transistor is surrounded by the STI structure 20.

The gate structure 30 shown in FIG. 5 is formed in the element isolation cell (fifth cell) 45. Specifically, the gate structure 30 is located in a region put between two N-type diffusion layers 13 (N-type diffusion layer group). The two N-type diffusion layers 13 extend to the ends of the element isolation cell 45 in the X-direction and an opposing direction. That is, each of two N-type diffusion layers 13 is contact with one of two opposing sides of the element isolation cell 45. The gate structure 30 is connected to the ground line 3 and voltage thereof is fixed to the ground voltage GND.

As shown in FIG. 5, the N-type diffusion layers 13 of a certain basic cell 44 are lined up with the N-type diffusion layers 13 of other basic cell 44 along the X-direction. Also, the N-type diffusion layers 13 of the basic cell 44 are lined up with the N-type diffusion layers 13 of the element isolation cell 45 in the X-direction. Conversely, it is designed that when the basic cells 44 and the element isolation cells 45 are arranged continuously along the X-direction, the N-type diffusion layers 13 are lined up. Therefore, it is possible to elongate the diffusion layer length DL to a desired length in the NMOS region by repeatedly providing the basic cells 44 and the element isolation cells 45. The element isolation cell 45 may simply be inserted appropriately at a position where electrical isolation is necessary.

Figure 6:
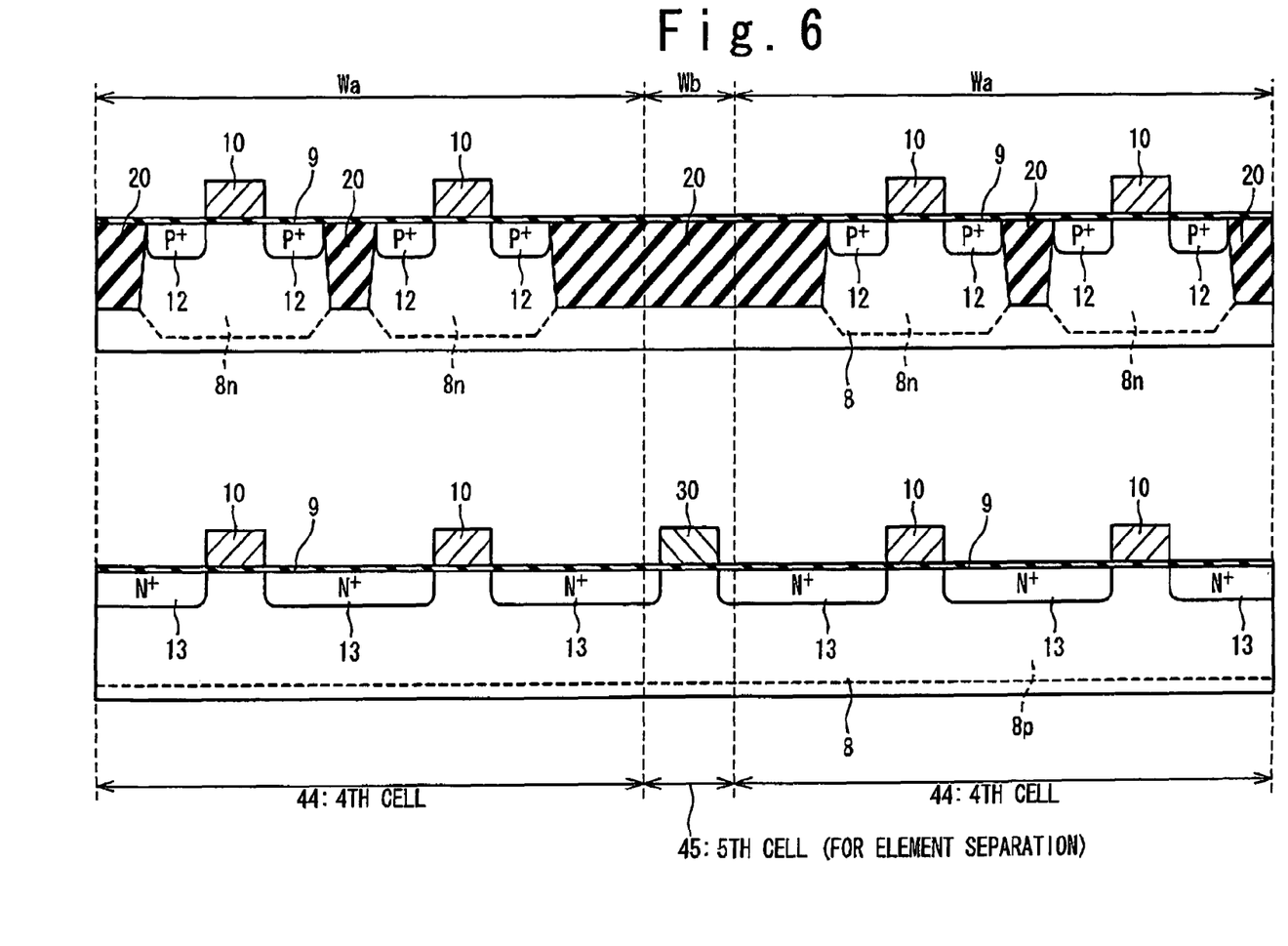
FIG. 6 is a sectional view showing the structure of the semiconductor device along the line A-A' and the line B-B' in FIG. 5.

FIG. 6 is a sectional view of the semiconductor device along the line A-A' and the line B-B' in FIG. 5. In the basic cell 44, the PMOS transistors and the NMOS transistors are formed on the substrate 8. In each of the transistors, the gate electrode 10 is formed on the substrate 8 via the gate insulating film 9. The P-type diffusion layers 12 and the N-type diffusion layers 13 are formed in the substrate 8 to be adjacent to a region under the gate electrode 10. Further, the PMOS transistors are surrounded by the STI structure 20 and the STI structure 20 is formed in the substrate 8 between adjacent PMOS transistors. It is supposed that the length of the basic cell 4 in the X-direction is Wa. Further, in the element isolation cell 45, the gate structure 30 is formed on the substrate 8 via the gate insulating film 9. The N-type diffusion layers 13 that are equivalent to the diffusion layers of the NMOS transistor are formed to be adjacent to a region under the gate structure 30. It is supposed that the length of the element isolation cell 45 in the X-direction is Wb. According to an example shown in FIG. 5, one basic cell 44 includes two PMOS transistors and two NMOS transistors. However, the number of transistors is not necessarily limited to two. For example, one basic cell 44 may include one PMOS transistor and one NMOS transistor. Further, one basic cell 44 may include four PMOS transistors and four NMOS transistors. Designing of the semiconductor device 1 is carried out by arranging the basic cells 44 and the element isolation cells 45 appropriately.

Figure 7:
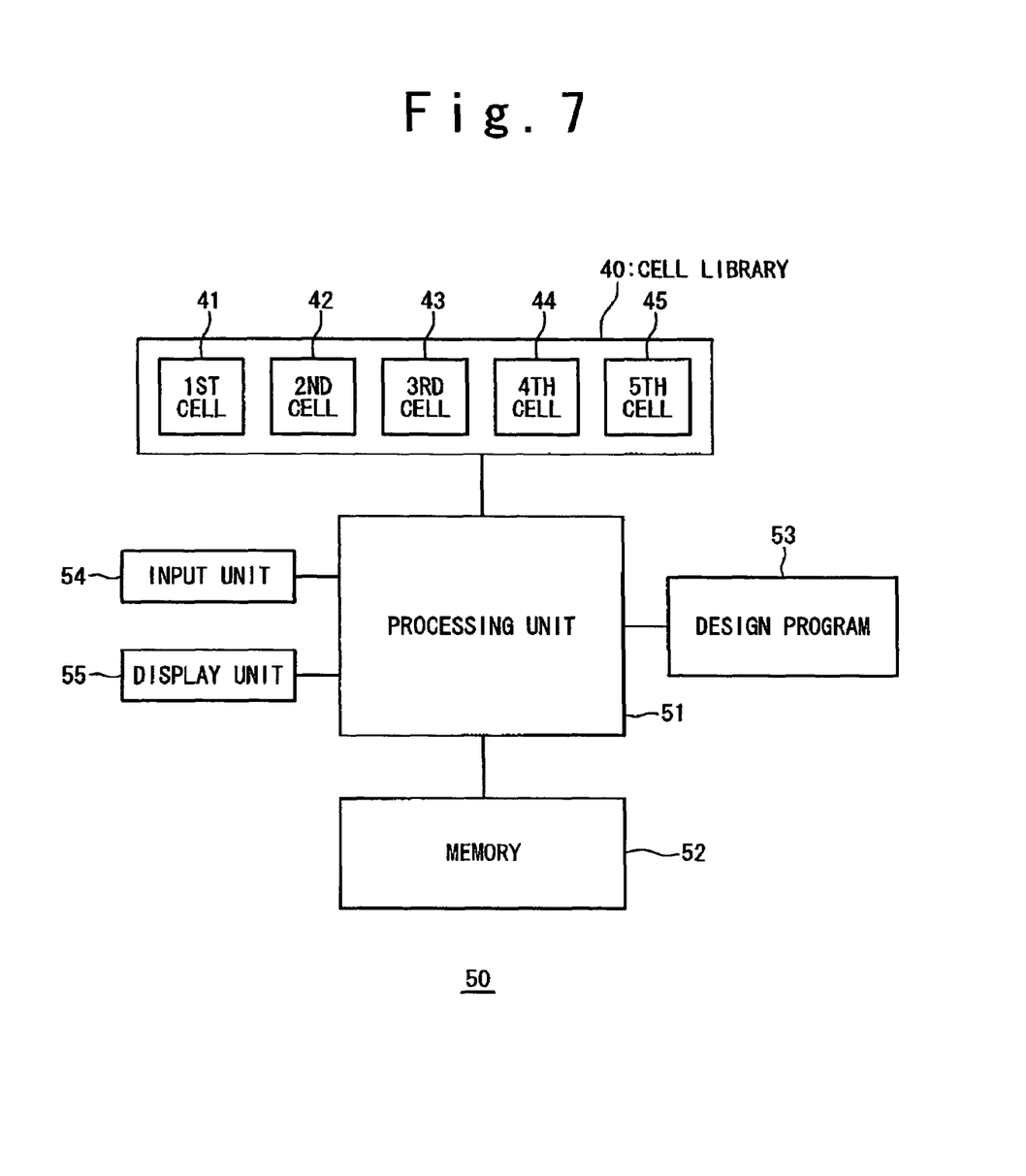
FIG. 7 is a block diagram showing the configuration of a semiconductor device design supporting system according to a first embodiment of the present invention.

FIG. 7 is a block diagram showing a system (CAD) for supporting design of the semiconductor device 1. This semiconductor device design supporting system 50 includes a cell library 40, a processing unit 51, a memory 52, a design program 53, an input unit 54 and a display unit 55. Data showing a plurality of cells are stored as a library in the cell library 40. The fourth cell 44 and the fifth cell 45 for the element isolation are included in the plurality of cells. Further, as the plurality of cells, the first cell 41 to the third cell 43 may be used. The cell library 40 is realized by, for example, a hard disc unit.

The memory 52 is used as a working area in which a layout is formed and a layout space is constructed therein. The processing unit 51 can access the cell library 40 and the memory 52. The design program (automatic layout tool) 53 is a computer program (software product) executed by the processing unit 51. As the input unit 54, a keyboard or a mouse is exemplified. A user (design person) can enter various commands using the input unit 54 while referring to information displayed on the display unit 55. The user can produce a layout data showing the layout of the semiconductor device 1 by use of semiconductor device designing system 50.

The processing unit 51 executes the following operation according to commands given from the design program 53. First, the processing unit 51 builds up a layout space on the memory 52. Next, the processing unit 51 reads out a data showing a cell to be used from the cell library 40. The cell is then arranged at a predetermined position on the layout space. For example, as shown in FIG. 5, the basic cell 44 is arranged repeatedly in the X-direction. Then, at a predetermined position, the element isolation cell 45 is arranged to be adjacent to the basic cells 44 arranged as mentioned. Thus, it is possible to elongate the diffusion layer length DL to a desired length in the NMOS region by arranging the basic cells 44 and the element isolation cells 45 repeatedly. The element isolation cell 45 may be inserted appropriately in the position that needs electrical isolation. Following this, wirings for connecting transistors are provided according to a logic circuit to be designed and manufactured.

Third Embodiment

Figure 8A:
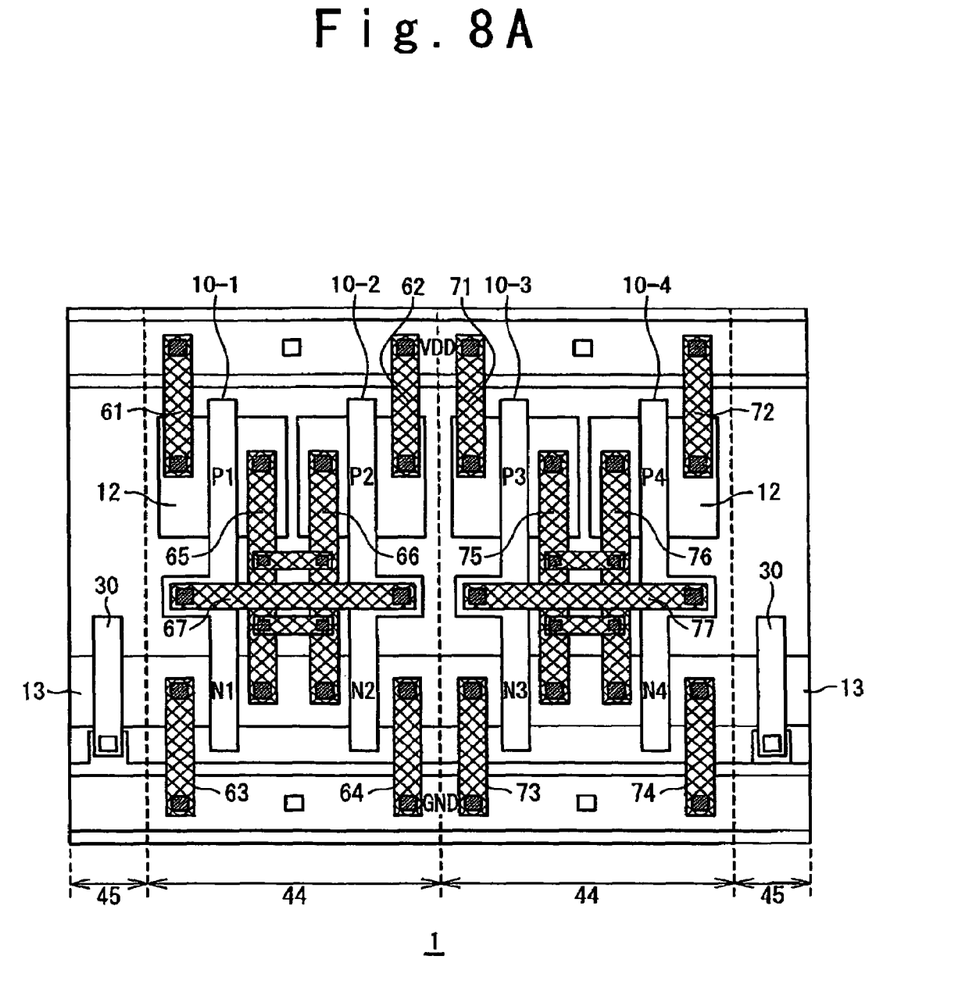
FIG. 8A is a top plan view showing the structure of inverters as the semiconductor device according to a third embodiment of the present invention.

FIG. 8A shows an example of wirings to be used for the structure of inverters as the semiconductor device according to the third embodiment of the present invention. A source of the PMOS transistor P1 is connected to a power supply line by a wiring 61. A source of the PMOS transistor P2 is connected to the power supply line by a wiring 62. A source of the NMOS transistor N1 is connected to a ground line by a wiring 63. A source of the NMOS transistor N2 is connected to the ground line by a wiring 64. A drain of the PMOS transistor P1 is connected to a drain of the NMOS transistor N1 by a wiring 65. A drain of the PMOS transistor P2 is connected to a drain of the NMOS transistor N2 by a wiring 66. Further, the wiring 65 and the wiring 66 are connected to each other. Further, a gate electrode 10-1 of the PMOS transistor P1 and the NMOS transistor N1, and a gate electrode 10-2 of the PMOS transistor P2 and the NMOS transistor N2 are connected via a wiring 67. With this configuration, a so-called "×2 inverter" is constituted.

Further, a source of the PMOS transistor P3 is connected to the power supply line by a wiring 71. A source of the PMOS transistor P4 is connected to the power supply line by a wiring 72. A source of the NMOS transistor N3 is connected to the ground line by a wiring 73. A source of the NMOS transistor N4 is connected to the ground line by a wiring 74. A drain of the PMOS transistor P3 is connected to a drain of the NMOS transistor N3 by a wiring 75. A drain of the PMOS transistor P4 is connected to a drain of the NMOS transistor N4 by a wiring 76. Besides, the wiring 75 and the wiring 76 are connected to each other. Further, a gate electrode 10-3 of the PMOS transistor P3 and the NMOS transistor N3, and a gate electrode 10-4 of the PMOS transistor P4 and the NMOS transistor N4 are connected via a wiring 77. With this configuration, a so-called "×2 inverter" is constituted.

Fourth Embodiment

Figure 8B:
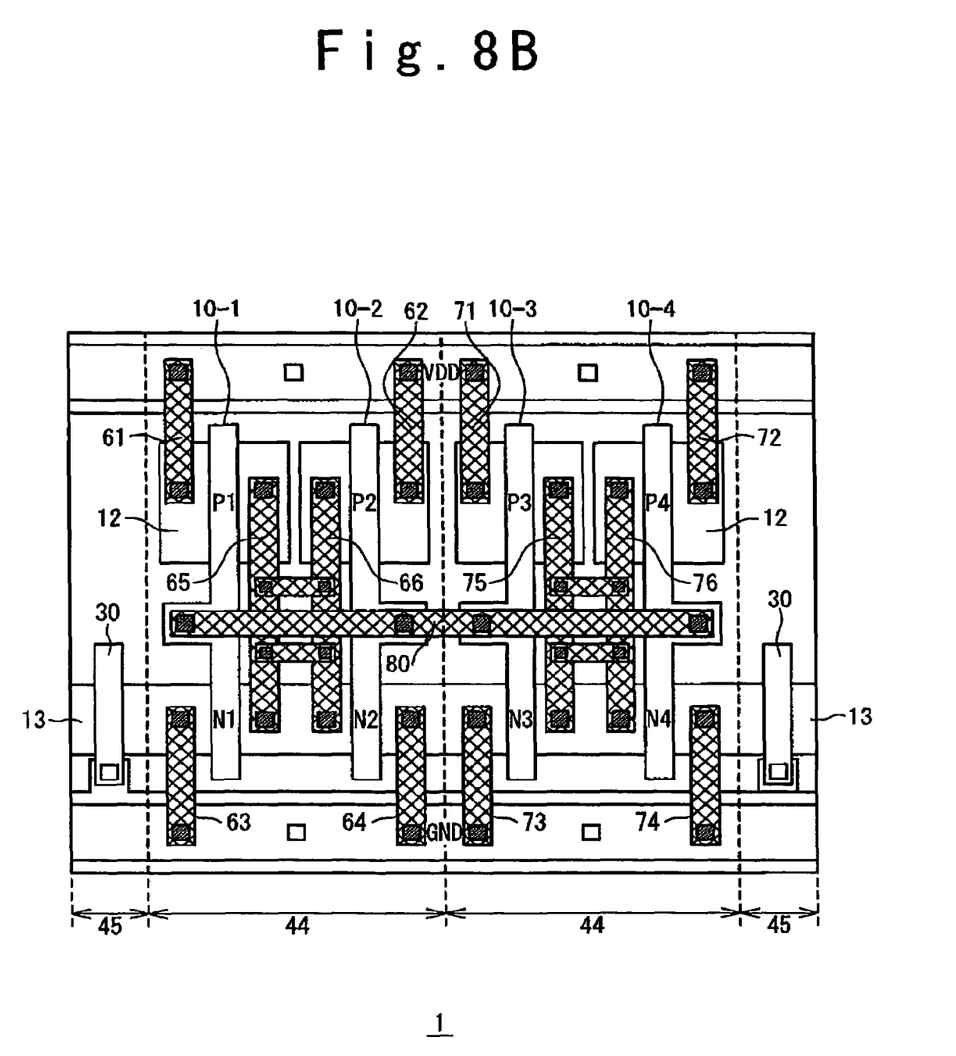
FIG. 8B is a top plan view showing the structure of inverters as the semiconductor device according to a fourth embodiment of the present invention.

FIG. 8B is a top plan view showing another structure of inverters as the semiconductor device according to the fourth embodiment of the present invention. In FIG. 8B, identical reference numerals or symbols are used for the same components as those shown in FIG. 8A and description thereof is omitted. In FIG. 8B, gate electrodes 10-1 to 10-4 are connected to each other via a wiring 80. With this configuration, a so-called "×4 inverter" is constituted. An inverter having greater driving capability than the inverter shown in FIG. 8A is thus realized.

In the LSI, various driving capabilities are required for inverters. According to the present embodiments, it is possible to realize inverters with various driving capabilities by changing wirings between transistors. Further, when a so-called "×8 inverter" is required, the number of repetitions of the basic cell 44 should be altered. Not limited to inverters, it is possible to design and manufacture various logic circuits by altering the number of times of repetition of the basic cell 44 and position of the element isolation cell 45. Further, it is possible to carry out the element isolation by inserting the element isolation cell 45 having the gate structure 30 in the desired position without effects by the diffusion layer length DL. According to the present invention, the degree of freedom in designing is improved. Therefore, it is possible to cope minutely with user's needs.

As shown in FIG. 5, the gate electrode 10 is preferably formed to extend along the Y-direction. In recent years, concept of DFM (Design for Manufacturing) are attracting attentions. In the DFM, a design rule is prepared considering a manufacturing process. For example, in order to reduce a circuit region, when a gate electrode is designed to pass through a complicated route, there is a possibility of generation of deviation in the width of gate polysilicon in actual manufacturing stage. That is, a gate electrode with a complicated configuration may result in deviation in the gate length L of transistors at manufacturing. The deviation in the gate length L is one of factors of deviation in characteristics of transistors. For this reason, according to the concept of DFM, it is preferable that the gate electrode 10 be designed to be a linear straight line at designing stage. With this consideration, the deviation in the gate length L is suppressed at actual designing stage. Therefore, performances of transistors are improved. According to the present invention, time and effort for considering effects of the diffusion layer length DL (STI structure stress) and deviation in the gate length L are eliminated.

Fifth Embodiment

Figure 9:
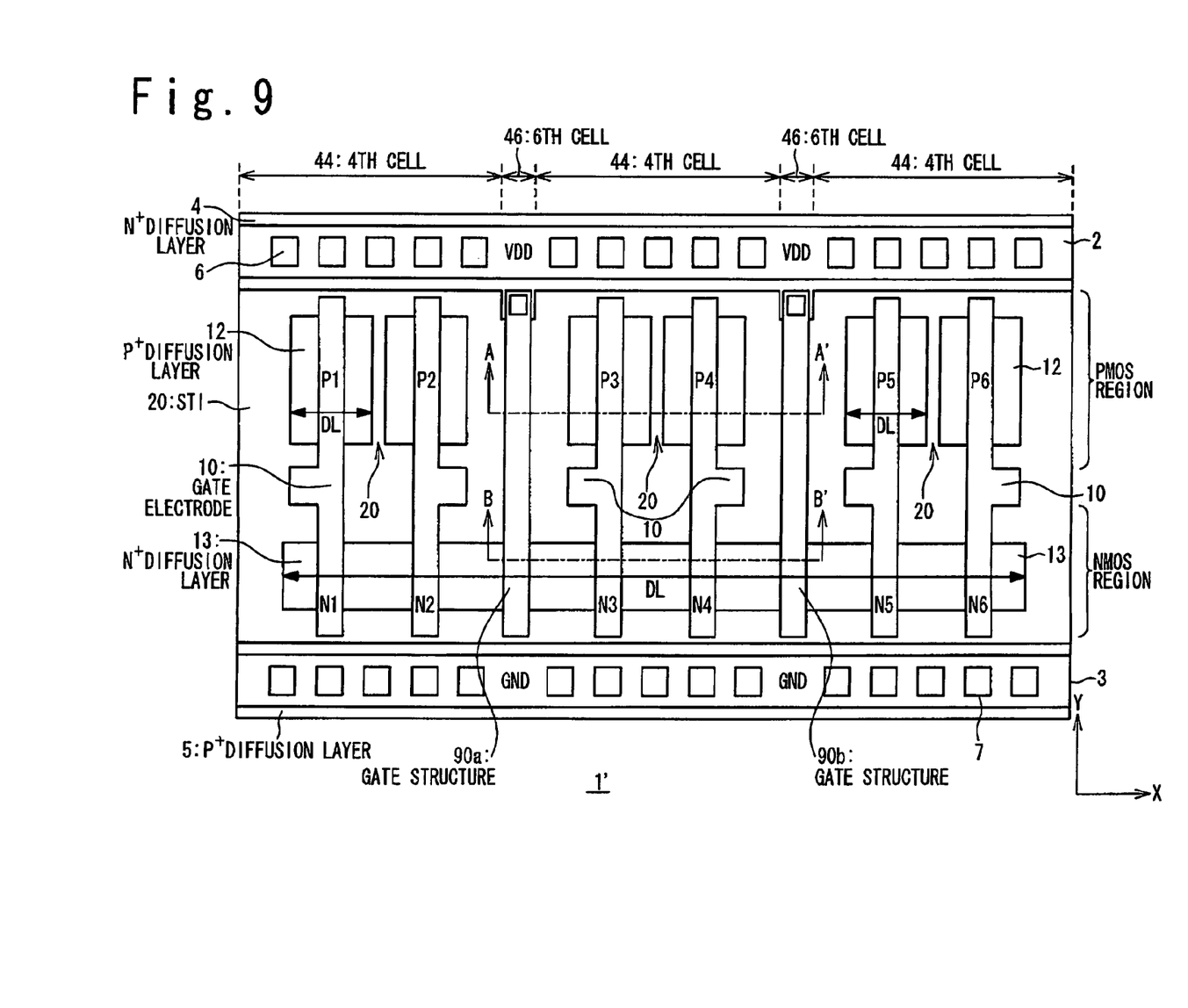
FIG. 9 is a top plan view showing the structure of the semiconductor device according to a fifth embodiment of the present invention.

FIG. 9 is a top plan view of the semiconductor device according to the fifth embodiment of the present invention. In FIG. 9, the same reference numerals or symbols are used for same components as those shown in FIG. 3, and the description thereof is omitted appropriately. In a semiconductor device 1' according to the fifth embodiment, a gate structure 90 is used instead of the gate structure 30 connected to the ground line 3. For example, in FIG. 9, a gate structure 90a is arranged between NMOS transistors N2 and N3. Besides, a gate structure 90b is arranged between NMOS transistors N3 and N4. These gate structures 90 are connected to the power supply line 2 and the voltage thereof is fixed to the power supply voltage VDD.

Figure 10A:
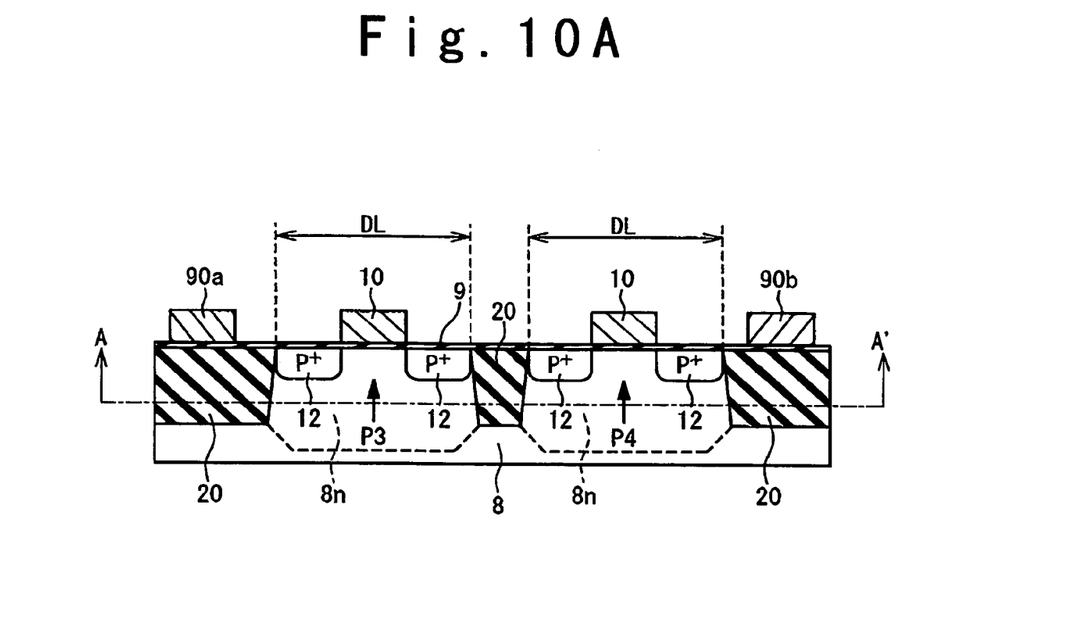
FIG. 10A is a sectional view showing the structure of the semiconductor device along the line A-A' in FIG. 9.
Figure 10B:
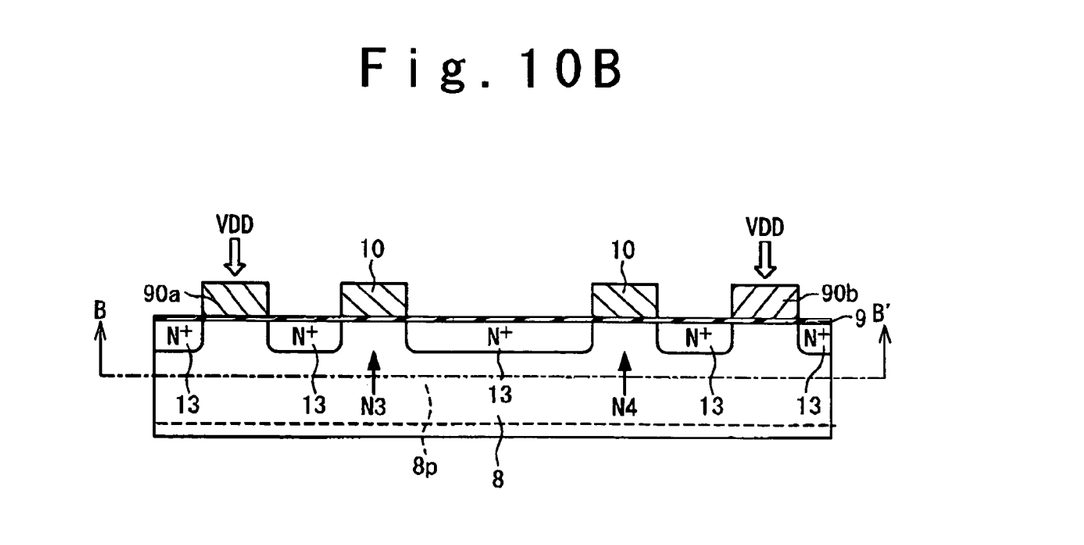
FIG. 10B is a sectional view showing the structure of the semiconductor device along the line B-B' in FIG. 9.

FIG. 10A is a sectional view of the semiconductor device according to the fifth embodiment along the line A-A' in FIG. 9. As shown in FIG. 10A, the PMOS transistors P3 and P4 are formed on the N-type regions 8*n* of the substrate 8 adjacently to each other. In each of PMOS transistors, the gate electrode 10 is formed on the substrate 8 via the gate insulating film 9. Further, the P-type diffusion layers 12 are formed in the N-type regions 8*n* of the substrate 8 to be adjacent to a region under the gate electrode 10. Each of the PMOS transistors is surrounded by the STI structure 20 and the STI structure 20 is formed in the substrate 8 between the PMOS transistors P3 and P4. Further, the gate structures 90*a* and 90*b* are formed on the STI structure 20 via the gate insulating film 9. Also, FIG. 10B is a sectional view of the semiconductor device according to the fifth embodiment along the line B-B' in FIG. 9. As shown in FIG. 10B, the NMOS transistors N3 and N4 are formed on the =type region 8*p* of the substrate 8 adjacently to each other. In each of NMOS transistors, the gate electrode 10 is formed on the substrate 8 via the gate insulating film 9. The N-type diffusion layers 13 are formed in the substrate 8 to be adjacent to a region under the gate electrode 10. Further, the gate structures 90*a* and 90*b* are formed on the substrate 8 via the gate insulating film 9. The N-type diffusion layers 13 are formed in the substrate 8 to be adjacent to a region under the gate structure 90. Further, power supply voltage VDD is applied to the gate structures 90*a* and 90*b*.

By using the gate structure 90 as mentioned above, it is possible to realize a circuit in which the number of PMOS transistors and the number of NMOS transistors are asymmetrical. For example, it is possible to realize a circuit of two PMOS transistors and four NMOS transistors. As a matter of fact, the grounded gate structure 30 may simply be formed in the position in which electrical isolation is needed, with a similar manner as the first embodiment. With this configuration, the element isolation is also realized. Such a structure is possible simply because no STI structure 20 is formed in the NMOS region. The gate structure is formed between adjacent NMOS transistors instead of the STI structure 20, and a voltage to be applied to the gate structure may be determined depending on the desired circuit.

According to the fifth embodiment, in a similar manner to the first embodiment, the characteristic of ON current can be improved for both the PMOS transistors and the NMOS transistors. Since driving capabilities of both PMOS transistors and the NMOS transistors can be improved, a delay time is reduced. Further, the semiconductor device 1' may be designed and manufactured based on the cell-base technique in a similar manner as the second embodiment. In such a case, in addition to the fourth cell (basic cell) 44 and the fifth cell (element isolation cell) 45, a sixth cell 46 shown in FIG. 9 may be used. It becomes possible to realize various logic circuits by disposing the fourth cell 44 repeatedly and by inserting the fifth cell 45 or the sixth cell 46 at the desired position.

What is claimed is:

1. A semiconductor device comprising:
   a plurality of PMOS transistors formed on a semiconductor substrate;
   a plurality of NMOS transistors formed on said semiconductor substrate; and
   a gate structure formed on said semiconductor substrate between an adjacent of said plurality of NMOS transistors to extend in a second direction perpendicular to a first direction over an N-type diffusion layer,
   wherein said plurality of PMOS transistors are surrounded and electrically isolated from each other by a device isolation structure formed in said semiconductor substrate,
   wherein said plurality of NMOS transistors are adjacent to each other and surrounded by said device isolation structure in said first direction such that said N-type diffusion layer of said plurality of NMOS transistors extends continuously with respect to said plurality of NMOS transistors in said first direction, and
   wherein one of said plurality of PMOS transistors and one of said plurality of NMOS transistors share a gate electrode.

2. The semiconductor device according to claim 1, wherein a ground voltage is applied to said gate structure.

3. The semiconductor device according to claim 1, wherein a power supply voltage is applied to said gate structure.

4. The semiconductor device according to claim 1, wherein said gate structure isolates a predetermined number of said plurality of said NMOS transistors.

5. The semiconductor device according to claim 4, wherein the predetermined number is two.

6. The semiconductor device according to claim 4, wherein the predetermined number is four.

7. The semiconductor device according to claim 4, wherein the predetermined number is six.

8. The semiconductor device according to claim 5, wherein said gate electrode of said one of said plurality of NMOS transistors is connected to another gate electrode of another one of said plurality of NMOS transistors.

9. The semiconductor device according to claim 6, wherein four of said gate electrodes of four of said plurality of NMOS transistors are connected to each other.

10. The semiconductor device according to claim 1, wherein said device isolation structure is formed between each of said plurality of PMOS transistors.

11. The semiconductor device according to claim 1, wherein each of said plurality of PMOS transistors comprises a P-type diffusion layer.

12. The semiconductor device according to claim 11, wherein a length of said N-type diffusion layer is greater than a length of said P-type diffusion layer.

13. The semiconductor device according to claim 1, wherein said plurality of NMOS transistors comprises an NMOS transistor group, and
    wherein said N-type diffusion layer extends throughout said NMOS transistor group in said first direction.

14. The semiconductor device according to claim 1, wherein said gate structure is connected to one of a ground line and a P-type diffusion layer connected to said ground line.

* * * * *